(12) United States Patent
Jang et al.

(10) Patent No.: US 11,901,461 B2
(45) Date of Patent: *Feb. 13, 2024

(54) THIN FILM TRANSISTOR COMPRISING OXIDE SEMICONDUCTOR LAYER AND SILICON SEMICONDUCTOR LAYER AND DISPLAY APPARATUS COMPRISING THE SAME

(71) Applicant: LG Display Co., Ltd., Seoul (KR)

(72) Inventors: Jaeman Jang, Paju-si (KR); PilSang Yun, Paju-si (KR); Jiyong Noh, Paju-si (KR); InTak Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,167

(22) Filed: Sep. 30, 2022

(65) Prior Publication Data

US 2023/0018306 A1 Jan. 19, 2023

Related U.S. Application Data

(63) Continuation of application No. 17/121,248, filed on Dec. 14, 2020, now Pat. No. 11,495,692.

(30) Foreign Application Priority Data

Dec. 26, 2019 (KR) ........................ 10-2019-0175593

(51) Int. Cl.
*H01L 29/786* (2006.01)
*H01L 29/66* (2006.01)

(52) U.S. Cl.
CPC .... *H01L 29/78693* (2013.01); *H01L 29/6675* (2013.01); *H01L 29/78618* (2013.01); *H01L 29/78696* (2013.01)

(58) Field of Classification Search
CPC ........... H01L 29/78693; H01L 29/6675; H01L 29/78618; H01L 29/78696; H01L 27/1225;
(Continued)

(56) References Cited

U.S. PATENT DOCUMENTS 8,247,812 B2 8/2012 Sakata et al.
9,698,279 B2 7/2017 Kim
(Continued)

FOREIGN PATENT DOCUMENTS

| KR | 10-2010-0092885 A | 8/2010 |
| KR | 10-2015-0092707 A | 8/2015 |
| KR | 10-2018-0024817 A | 3/2018 |

OTHER PUBLICATIONS

United States Office Action, U.S. Appl. No. 17/121,248, filed Apr. 25, 2022, 11 pages.
(Continued)

*Primary Examiner* — Tong-Ho Kim
(74) *Attorney, Agent, or Firm* — Fenwick & West LLP

(57) ABSTRACT

Disclosed are a thin film transistor, a display apparatus comprising the thin film transistor, and a method for manufacturing the thin film transistor. The thin film transistor comprises an active layer, and a gate electrode spaced apart from the active layer and configured to have at least a portion overlapped with the active layer, wherein the active layer includes a silicon semiconductor layer, and an oxide semiconductor layer which contacts the silicon semiconductor layer, wherein at least a portion of the silicon semiconductor layer and at least a portion of the oxide semiconductor layer are overlapped with the gate electrode.

19 Claims, 13 Drawing Sheets

(58) Field of Classification Search
CPC .............. H01L 29/7869; H01L 21/34; G02F 1/136277; G02F 1/1368; H10K 59/1213; H10K 50/00
USPC ......................................................... 257/59
See application file for complete search history.

(56) References Cited

U.S. PATENT DOCUMENTS

| | | |
|---|---|---|
| 9,705,002 B2 | 7/2017 | Yamazaki et al. |
| 10,096,721 B2 | 10/2018 | Yamazaki et al. |
| 10,297,622 B2 | 5/2019 | Na et al. |
| 11,495,692 B2 * | 11/2022 | Jang ................. H01L 29/78693 |
| 2010/0207117 A1 | 8/2010 | Sakata et al. |
| 2015/0108454 A1 * | 4/2015 | Kim ................... H01L 27/1225 257/43 |
| 2015/0221775 A1 | 8/2015 | Yamazaki et al. |
| 2017/0271520 A1 | 9/2017 | Yamazaki et al. |
| 2017/0278980 A1 | 9/2017 | Kim |
| 2017/0323978 A1 | 11/2017 | Tokunaga et al. |
| 2018/0061868 A1 | 3/2018 | Na et al. |

OTHER PUBLICATIONS

Korean Intellectual Property Office, Office Action, Korean Patent Application No. 10-2019-0175593, dated Oct. 25, 2023, 12 pages.
China National Intellectual Property Administration, Office Action, Chinese Patent Application No. 202011551240.2, dated Dec. 1, 2023, 12 pages.

* cited by examiner

THIN FILM TRANSISTOR COMPRISING OXIDE SEMICONDUCTOR LAYER AND SILICON SEMICONDUCTOR LAYER AND DISPLAY APPARATUS COMPRISING THE SAME

CROSS-REFERENCE TO RELATED APPLICATIONS

This application is a continuation application of U.S. patent application Ser. No. 17/121,248, filed on Dec. 14, 2020, which claims the benefit of Republic of Korea Patent Application No. 10-2019-0175593 filed on Dec. 26, 2019, all of which are hereby incorporated by reference as if fully set forth herein.

BACKGROUND

Field

The present disclosure relates to a thin film transistor and a display apparatus. In more detail, the present disclosure relates to a thin film transistor comprising an oxide semiconductor layer and a silicon semiconductor layer, and a display apparatus comprising the thin film transistor.

Discussion of the Related Art

A thin film transistor may be manufactured on a glass substrate or a plastic substrate, whereby the thin film transistor is widely used as a switching device or a driving device in a display apparatus such as a liquid crystal display device or an organic light emitting device.

According to a material used for an active layer, the thin film transistor may be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

The amorphous silicon is deposited in a short time, and is formed as an active layer, whereby the amorphous silicon thin film transistor (a-Si TFT) has advantages of short manufacturing time and low manufacturing cost. Meanwhile, it has disadvantages of inferior current driving efficiency due to low mobility, and a change of a threshold voltage.

The polycrystalline silicon thin film transistor (poly-Si TFT) may be obtained by depositing amorphous silicon and crystallizing the deposited amorphous silicon. The polycrystalline silicon thin film transistor has advantages of high electron mobility and great stability, realization of thin profile and high resolution, and high power efficiency. The polycrystalline silicon thin film transistor may include a low temperature poly silicon (LTPS) thin film transistor, and a polysilicon thin film transistor. However, a process of manufacturing the polycrystalline silicon thin film transistor inevitably needs a step of crystallizing the amorphous silicon, whereby a manufacturing cost is increased due to the increased number of manufacturing steps, and a crystallization is carried out at a high temperature. Also, due to the properties of polycrystallization, it is difficult to secure uniformity of the polycrystalline silicon thin film transistor.

The oxide semiconductor thin film transistor (oxide semiconductor TFT), which has a large resistance change in accordance with an oxygen content, is advantageous in that it facilitates to obtain the desired properties. Also, an active layer of oxide is formed at a relatively low temperature for a process of manufacturing the oxide semiconductor thin film transistor, whereby it is possible to lower a manufacturing cost. Also, owing to the properties of oxide, an oxide semiconductor is transparent, whereby it is favorable to realization of a transparent display apparatus. However, in comparison to the polycrystalline silicon thin film transistor, the oxide semiconductor thin film transistor has relatively low stability and low electron mobility.

Accordingly, there are continuous studies for utilizing the strength and remedying the weakness of the oxide semiconductor thin film transistor and the polycrystalline silicon thin film transistor.

SUMMARY

The present disclosure has been made in view of the above problems, and it is an object of the present disclosure to provide a thin film transistor comprising an oxide semiconductor layer and a silicon semiconductor layer together.

It is another object of the present disclosure to provide a thin film transistor comprising an oxide semiconductor layer and a silicon semiconductor layer and having good switching properties.

It is a further another object of the present disclosure to provide a thin film transistor comprising an oxide semiconductor layer and a silicon semiconductor layer and having good mobility and large s-factor.

It is a further another object of the present disclosure to provide a display apparatus comprising a thin film transistor.

In accordance with an aspect of the present disclosure, the above and other objects can be accomplished by the provision of a thin film transistor comprising an active layer, and a gate electrode spaced apart from the active layer and configured to have at least a portion overlapped with the active layer, wherein the active layer includes a silicon semiconductor layer, and an oxide semiconductor layer which contacts the silicon semiconductor layer, wherein at least a portion of the silicon semiconductor layer and at least a portion of the oxide semiconductor layer are overlapped with the gate electrode.

An entire area of a contact portion where the silicon semiconductor layer and the oxide semiconductor layer contact may be overlapped with the gate electrode.

At least a portion of the oxide semiconductor layer may be overlapped with the silicon semiconductor layer in a thickness direction.

The silicon semiconductor layer and the oxide semiconductor layer may not be overlapped with each other in a thickness direction.

The silicon semiconductor layer may be provided to be 50% or more of an overlap area between the active layer and the gate electrode.

The silicon semiconductor layer may be provided while being not overlapped with the oxide semiconductor layer in a corresponding area 50% or more of an overlap area between the active layer and the gate electrode.

The thin film transistor may further comprise a source electrode and a drain electrode which are spaced apart from each other and are respectively connected with the active layer, wherein any one of the source electrode and the drain electrode is connected with the silicon semiconductor layer, and the other of the source electrode and the drain electrode is connected with the oxide semiconductor layer.

The active layer includes a channel portion which is overlapped with the gate electrode, a source region which is connected with the channel portion and is not overlapped with the gate electrode, and a drain region which is spaced apart from the source region and connected with the channel portion, and is not overlapped with the gate electrode, wherein, if a distance between the source region and the drain region in the channel portion is referred to as a channel length, a length of a portion of the silicon semiconductor layer being not overlapped with the oxide semiconductor layer is 50% to 90% of the channel length.

The oxide semiconductor layer which is not overlapped with the silicon semiconductor layer may be provided in at least some regions of the channel portion along a line configured to connect the source region and the drain region with each other.

Any one of the source region and the drain region may be provided in the silicon semiconductor layer, and the other of the source region and the drain region is provided in the oxide semiconductor layer.

The oxide semiconductor layer may include a first oxide semiconductor layer, and a second oxide semiconductor layer on the first oxide semiconductor layer.

The oxide semiconductor layer may be disposed at each of one side and the other side of the silicon semiconductor layer.

In accordance with another aspect of the present disclosure, there is provided a display apparatus comprising the above thin film transistor.

The thin film transistor is a driving transistor.

In accordance with another aspect of the present disclosure, there is provided a method for manufacturing a thin film transistor comprising providing an active layer on a substrate, and providing a gate electrode having at least a portion overlapped with the active layer, wherein the step of providing the active layer includes providing a silicon semiconductor layer on the substrate, and providing an oxide semiconductor layer which contacts the silicon semiconductor layer on the substrate, wherein the gate electrode is overlapped with at least a portion of the silicon semiconductor layer and at least a portion of the oxide semiconductor layer.

The method may further comprise a selective conductivity providing process for the active layer by using the gate electrode as a mask.

The selective conductivity providing process for the active layer may include doping a portion of the active layer, which is not overlapped with the gate electrode, with ions.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION

Figure 1:
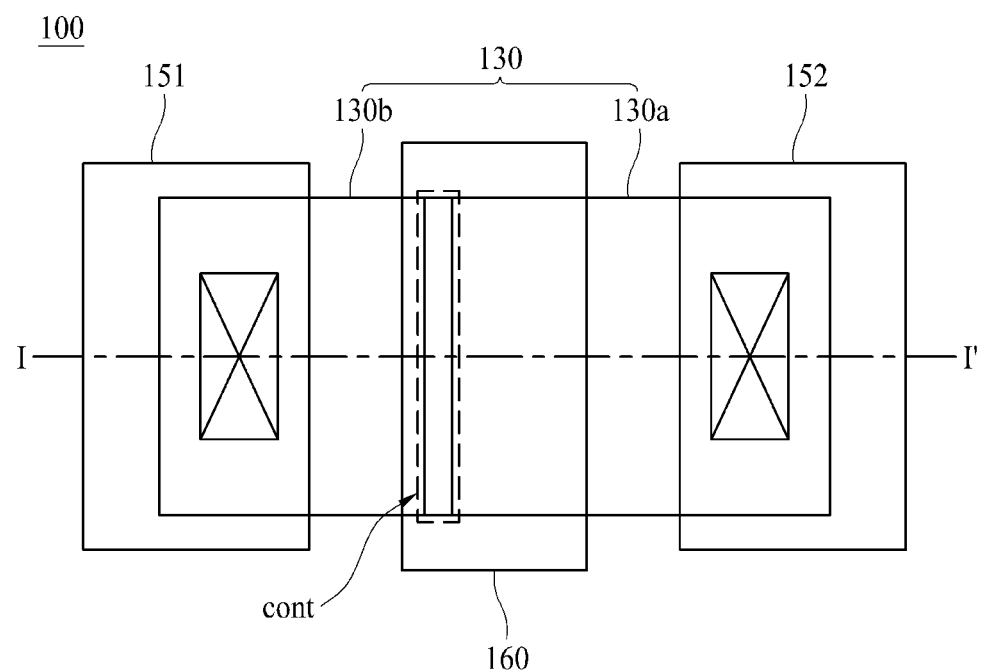
FIG. 1 is a plan view illustrating a thin film transistor according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

Figure 2:
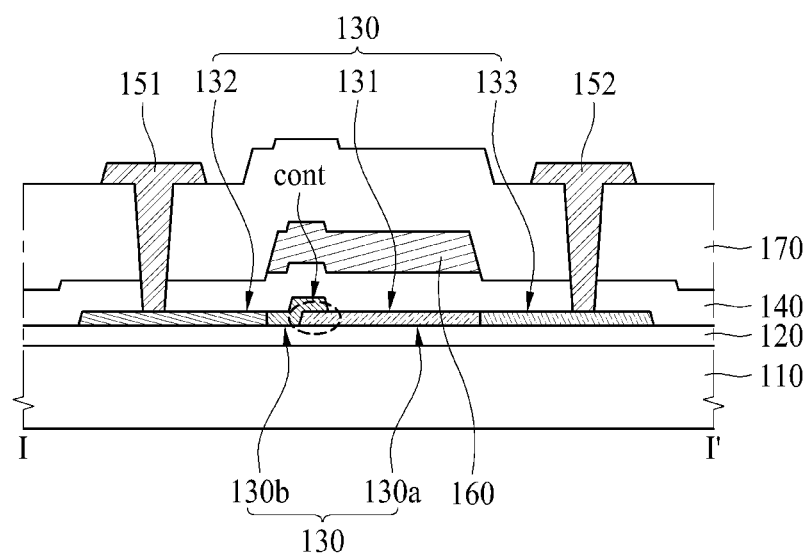
FIG. 2 is a cross sectional view along I-I' of FIG. 1 according to an embodiment of the present disclosure.

FIG. 1 is a plan view illustrating a thin film transistor 100 according to one embodiment of the present disclosure, and FIG. 2 is a cross sectional view along I-I' of FIG. 1.

Referring to FIGS. 1 and 2, the thin film transistor 100 according to one embodiment of the present disclosure includes an active layer 130, and a gate electrode 160 spaced apart from the active layer 130 and configured to have at least a portion overlapped with the active layer 130.

The active layer 130 includes a silicon semiconductor layer 130a, and an oxide semiconductor layer 130b which contacts the silicon semiconductor layer 130a. At least a portion of the silicon semiconductor layer 130a and at least a portion of the oxide semiconductor layer 130b are overlapped with the gate electrode 160.

Referring to FIG. 2, the active layer 130 is disposed on a substrate 110.

The substrate 110 may be formed of glass or plastic. For example, the substrate 110 may be formed of a transparent plastic material having flexibility, for example, polyimide.

A buffer layer 120 is disposed on the substrate 110. The buffer layer 120 may include at least one of silicon oxide and silicon nitride. The buffer layer 120 protects the active layer 130, and planarizes an upper surface of the substrate 110. The buffer layer 120 may be omittable.

The active layer 130 is disposed on the buffer layer 120. The active layer 130 includes the silicon semiconductor layer 130a, and the oxide semiconductor layer 130b.

According to one embodiment of the present disclosure, the kind of the silicon semiconductor layer 130a has no limitations. A layer of a semiconductor material comprising silicon may be the silicon semiconductor layer 130a according to one embodiment of the present disclosure. For example, the silicon semiconductor layer 130a may include amorphous silicon or polycrystalline silicon. In more detail, the silicon semiconductor layer 130a may be formed of low temperature polysilicon (LTPS).

The oxide semiconductor layer 130b contacts the silicon semiconductor layer 130a. According to one embodiment of the present disclosure, the oxide semiconductor layer 130b may be disposed on the same layer as that of the silicon semiconductor layer 130a.

The oxide semiconductor layer 130b includes an oxide semiconductor material. For example, the oxide semiconductor layer 130b may include at least one among IZO (InZnO)-based oxide semiconductor, IGO(InGaO)-based oxide semiconductor, ITO(InSnO)-based oxide semiconductor, IGZO(InGaZnO)-based oxide semiconductor, IGZTO (InGaZnSnO)-based oxide semiconductor, GZTO (GaZnSnO)-based oxide semiconductor, GZO(GaZnO)-based oxide semiconductor, GO(GaO)-based oxide semiconductor, and ITZO(InSnZnO)-based oxide semiconductor. However, one embodiment of the present disclosure is not limited to the above. The active layer 130 may be formed of other oxide semiconductor materials generally known to those in the art. A detailed structure of the active layer 130 will be described later.

A gate insulating film 140 is disposed on the active layer 130. The gate insulating film 140 may include at least one of silicon oxide and silicon nitride, and the gate insulating film 140 may include metal oxide or metal nitride. The gate insulating film 140 may be formed in a single-layered structure, or a multi-layered structure.

The gate electrode 160 is disposed on the gate insulating film 140. The gate electrode 160 is insulated from the active layer 130, and at least a portion of the gate electrode 160 is overlapped with the active layer 130.

The gate electrode 160 may include at least one among aluminum-based metal such as aluminum (Al) or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The gate electrode 160 may have a multi-layered structure including at least two conductive layers with the different physical properties.

An insulating interlayer 170 is disposed on the gate electrode 160. The insulating interlayer 170 is an insulating layer formed of an insulating material. In detail, the insulating interlayer 170 may be formed of an organic material, an inorganic material, or a deposition structure comprising an organic material and an inorganic material.

A source electrode 151 and a drain electrode 152 are disposed on the insulating interlayer 170. The source electrode 151 and the drain electrode 152 are spaced apart from each other, and are connected with the active layer 130. The source electrode 151 and the drain electrode 152 are respectively connected with the active layer 130 through contact holes provided in the insulating interlayer 170.

Each of the source electrode 151 and the drain electrode 152 may include at least one among molybdenum (Mo), aluminum (Al), chrome (Cr), aurum (Au), titanium (Ti), nickel (Ni), neodymium (Nd), copper (Cu), and their alloys. Each of the source electrode 151 and the drain electrode 152 may be formed in a single-layered structure including the above metal or its alloy, or may be formed in a multi-layered structure including at least two layers of the above metal or its alloy.

According to one embodiment of the present disclosure, any one of the source electrode 151 and the drain electrode 152 is connected with the silicon semiconductor layer 130a, and the remaining may be connected with the oxide semiconductor layer 130b. Referring to FIGS. 1 and 2, the source electrode 151 is connected with the oxide semiconductor layer 130b, and the drain electrode 152 may be connected with the silicon semiconductor layer 130a. However, one embodiment of the present disclosure is not limited to the above. For example, the source electrode 151 may be connected with the silicon semiconductor layer 130a, and the drain electrode 152 may be connected with the oxide semiconductor layer 130b.

Hereinafter, the active layer 130 will be described in detail.

Figure 3:
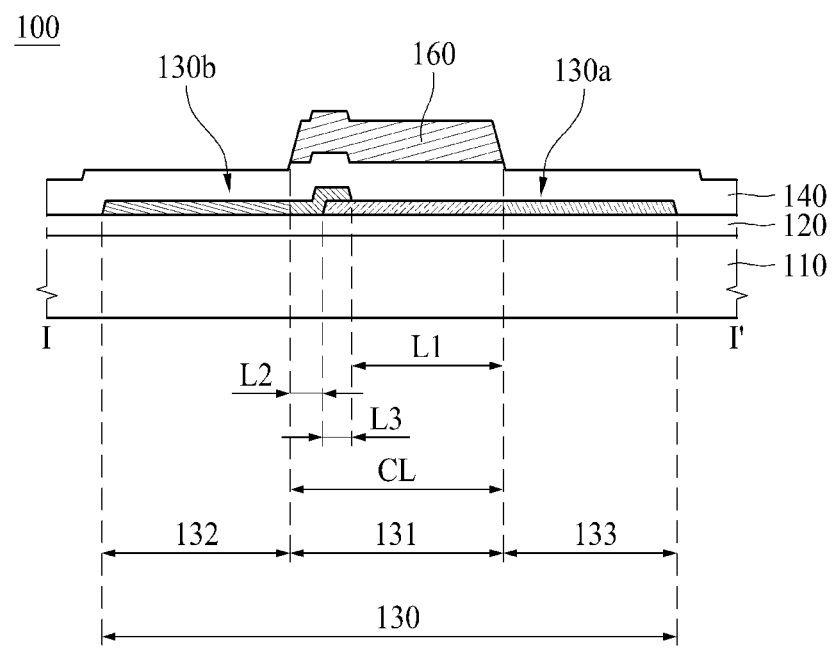
FIG. 3 is a detailed cross sectional view illustrating an active layer shown in FIG. 2 according to an embodiment of the present disclosure.

Referring to FIGS. 1, 2, and 3, the active layer 130 includes the silicon semiconductor layer 130a, and the oxide semiconductor layer 130b. At least a portion of the silicon semiconductor layer 130a and at least a portion of the oxide semiconductor layer 130b are overlapped with the gate electrode 160. Accordingly, at least a portion of the silicon semiconductor layer 130a and at least a portion of the oxide semiconductor layer 130b may constitute a channel portion 131 of the thin film transistor 100.

According to one embodiment of the present disclosure, the active layer 130 may be selectively provided with conductivity by a selective conductivity providing process using the gate electrode 160 as a mask.

A portion of the active layer 130, which is overlapped with the gate electrode 160, is not provided with conductivity, and thus becomes the channel portion 131. Some portions of the active layer 130, which are not overlapped with the gate electrode 160, are provided with conductivity, and thus become conducting portions 132 and 133. The conducting portions 132 and 133 are provided at both sides of the channel portion 131, generally.

According to one embodiment of the present disclosure, the active layer 130 may be selectively provided with conductivity by a doping process using dopant. In this case, a doped region may be provided with conductivity. For the doping process, 5A group elements may be used. For example, at least one among phosphorous (P) ion, arsenic (As) ion, and antimony (Sb) ion may be used for the doping process.

However, one embodiment of the present disclosure is not limited to the above. For example, the active layer 130 may be selectively provided with conductivity by a plasma treatment or a dry etch process, or may be selectively provided with conductivity by a photo-irradiation process.

Any one of the conducting portions 132 and 133 becomes a source region 132, and the other becomes a drain region 133. The source region 132 may function as a source connection portion connected with the source electrode 151, and the drain region 133 may function as a drain connection portion connected with the drain electrode 152.

The source region 132 and the drain region 133 shown in the drawings are distinguished from each other, for convenience of explanation. According to a voltage, the source region 132 shown in the drawings may become the drain region 133, and the drain region 133 may become the source region 132. Also, if needed, the source region 132 may become the source electrode 151 or the drain electrode 152, and the drain region 133 may become the drain electrode 152 or the source electrode 151.

According to one embodiment of the present disclosure, any one of the source region 132 and the drain region 133 is provided in the silicon semiconductor layer 130a, and the other of the source region 132 and the drain region 133 may be provided in the oxide semiconductor layer 130b. Referring to FIG. 2, the source region 132 is provided in the oxide semiconductor layer 130b, and the drain region 133 may be provided in the silicon semiconductor layer 130a. However, one embodiment of the present disclosure is not limited to the above. For example, the source region 132 may be provided in the silicon semiconductor layer 130a, and the drain region 133 may be provided in the oxide semiconductor layer 130b.

Referring to FIGS. 1 and 2, an entire area of contact portion (cont) where the silicon semiconductor layer 130a and the oxide semiconductor layer 130b contact each other is overlapped with the gate electrode 160. In detail, the contact portion (cont) between the silicon semiconductor layer 130a and the oxide semiconductor layer 130b is positioned in the channel portion 131.

Also, referring to FIGS. 1 and 2, at least a portion of the oxide semiconductor layer 130b is overlapped with the silicon semiconductor layer 130a at a thickness direction.

A crystallization process for forming the silicon semiconductor layer 130a may be needed. Thus, according to one embodiment of the present disclosure, the silicon semiconductor layer 130a is firstly provided on the substrate 110. After that, the oxide semiconductor layer 130b is provided, and the oxide semiconductor layer 130b contacts the silicon semiconductor layer 130a. In order to make a stable contact between the oxide semiconductor layer 130b and the silicon semiconductor layer 130a, according to one embodiment of the present disclosure, a portion of an end of the oxide semiconductor layer 130b is overlapped with a portion of an end of the silicon semiconductor layer 130a.

However, one embodiment of the present disclosure is not limited to the above. For example, without an overlapped portion between the oxide semiconductor layer 130b and the silicon semiconductor layer 130a, a lateral surface of the oxide semiconductor layer 130b may contact a lateral surface of the silicon semiconductor layer 130a.

Referring to FIGS. 1 and 2, any one side of the channel portion 131 is the silicon semiconductor layer 130a, and the other side of the channel portion 131 may be the oxide semiconductor layer 130b. According to one embodiment of the present disclosure, charges which flow through the channel portion 131 pass through both the silicon semiconductor layer 130a and the oxide semiconductor layer 130b. As a result, the thin film transistor 100 according to one embodiment of the present disclosure may have both the properties of a silicon thin film transistor and the properties of an oxide semiconductor thin film transistor.

In detail, the thin film transistor 100 according to one embodiment of the present disclosure may have the properties of a silicon thin film transistor such as a large mobility and a large s-factor, and may have the properties of an oxide semiconductor thin film transistor such as a low off current. Thus, the thin film transistor 100 according to one embodiment of the present disclosure may have the good current properties in an ON-state, and may prevent a leakage current in an OFF-state. Also, according as the thin film transistor 100 according to one embodiment of the present disclosure has a large s-factor, the thin film transistor 100 according to one embodiment of the present disclosure may be used as a driving transistor of a display apparatus.

In the thin film transistor 100 according to one embodiment of the present disclosure, the current properties such as the mobility and the s-factor may be mainly determined by the silicon semiconductor layer 130a. In order to realize the electrical properties of the silicon semiconductor layer 130a in the channel portion 131, the silicon semiconductor layer 130a may be provided to be 50% or more of the overlap area between the active layer 130 and the gate electrode 160. For example, the silicon semiconductor layer 130a may be provided in such a way that an occupy area of the silicon semiconductor layer 130a is to be 50% or more of the entire area of the channel portion 131.

Also, in order to prevent the electrical properties of the silicon semiconductor layer 130a from being deteriorated by the overlap with the oxide semiconductor layer 130b, the silicon semiconductor layer 130a may be provided in such a way that the silicon semiconductor layer 130a is not overlapped with the oxide semiconductor layer 130b in the area 50% or more of the overlap area between the active layer 130 and the gate electrode 160. For example, only the silicon semiconductor layer 130a may be provided in the area 50% or more of the channel portion 131. The oxide semiconductor layer 130b may be provided in the area less than 50% of the channel portion 131.

FIG. 3 is a detailed cross sectional view illustrating the active layer 130 shown in FIG. 2.

As shown in FIG. 3, the active layer 130 includes the channel portion 131 overlapped with the gate electrode 160, the source region 132 which is connected with the channel portion 131 and is not overlapped with the gate electrode 160, and the drain region 133 which is apart from the source region 132 and is connected with the channel portion 131, and is not overlapped with the gate electrode 160.

According to one embodiment of the present disclosure, in the channel portion 131, a distance, for example, a straight distance, between the source region 132 and the drain region 133 may be referred to as a channel length (CL). In the channel portion 131, a length (L1) of the silicon semiconductor layer 130a which is not overlapped with the oxide semiconductor layer 130b may be 50%~90% of the channel length (CL).

In the channel portion 131, if the length (L1) of the silicon semiconductor layer 130a which is not overlapped with the oxide semiconductor layer 130b is less than 50% of the channel length (CL), the properties of the silicon thin film transistor such as the mobility and the s-factor are not sufficiently improved so that the thin film transistor 100 might not be provided with the sufficiently large mobility and the sufficiently large s-factor.

Meanwhile, in the channel portion 131, if the length (L1) of the silicon semiconductor layer 130a which is not overlapped with the oxide semiconductor layer 130b is more than 90% of the channel length (CL), a length (L2) having only the oxide semiconductor layer 130b becomes small so that the properties of the oxide semiconductor film transistor such as the off-current properties are not sufficiently improved, that is, a leakage current may be generated in the thin film transistor 100 in an OFF-state.

According to one embodiment of the present disclosure, in order to secure the properties of the oxide semiconductor thin film transistor, the oxide semiconductor layer 130b being not overlapped with the silicon semiconductor layer 130a is provided in at least some regions of the channel portion 131 along a line, for example, a straight line, configured to connect the source region 132 and the drain region 133 with each other.

In FIG. 3, the length (L2) of some area of the channel portion 131 in which only the oxide semiconductor layer 130b is provided may be 1%~10% of the channel length (CL).

According to one embodiment of the present disclosure, if the silicon semiconductor layer 130a and the oxide semiconductor layer 130b are spaced apart from each other without any contact, it might be impossible to drive the thin film transistor 100. Thus, in consideration of a process margin, the silicon semiconductor layer 130a and the oxide semiconductor layer 130b are designed to be partially overlapped with each other.

If a length (L3) of the overlap portion between the silicon semiconductor layer 130a and the oxide semiconductor layer 130b is increased in the channel portion 131, the mobility properties of the silicon semiconductor layer 130a may be lowered. Thus, the length (L3) of the overlap portion between the silicon semiconductor layer 130a and the oxide semiconductor layer 130b may be less than 40% of the channel length (CL), may be less than 10% of the channel length (CL), and may be less than 5% of the channel length (CL).

According to one embodiment of the present disclosure, in consideration of a process margin, the length (L3) of the overlap portion between the silicon semiconductor layer 130a and the oxide semiconductor layer 130b may be less than 0.5 μm along a direction of the channel length (CL).

Figure 4:
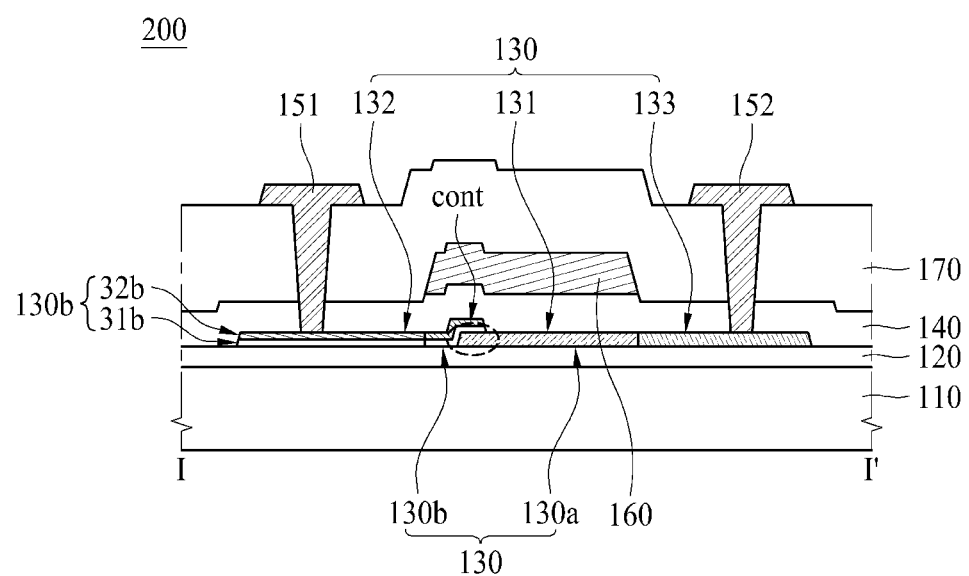
FIG. 4 is a cross sectional view illustrating a thin film transistor according to another embodiment of the present disclosure.

FIG. 4 is a cross sectional view illustrating a thin film transistor 200 according to another embodiment of the present disclosure.

Referring to FIG. 4, an oxide semiconductor layer 130b includes a first oxide semiconductor layer 31b, and a second oxide semiconductor layer 32b on the first oxide semiconductor layer 31b. The first oxide semiconductor layer 31b serves as a supporting layer for supporting the second oxide semiconductor layer 32b, and the second oxide semiconductor layer 32b serves as a channel layer. In FIG. 4, the source region 132 is provided in the oxide semiconductor layer 130b, and the drain region 133 is provided in the silicon semiconductor layer 130a.

The first oxide semiconductor layer 31b serving as the supporting layer has great film stability and good mechanical properties. For example, the first oxide semiconductor layer 31b may include at least one of IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material. However, one embodiment of the present disclosure is not limited to the above. The first oxide semiconductor layer 31b may be formed of other oxide semiconductor materials generally known to those in the art.

For example, the second oxide semiconductor layer 32b may be formed of at least one of IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO(GaZnSnO)-based oxide semiconductor material, and ITZO(InSnZnO)-based oxide semiconductor material. However, one embodiment of the present disclosure is not limited to the above. The second oxide semiconductor layer 32b may be formed of other oxide semiconductor materials generally known to those in the art.

Figure 5:
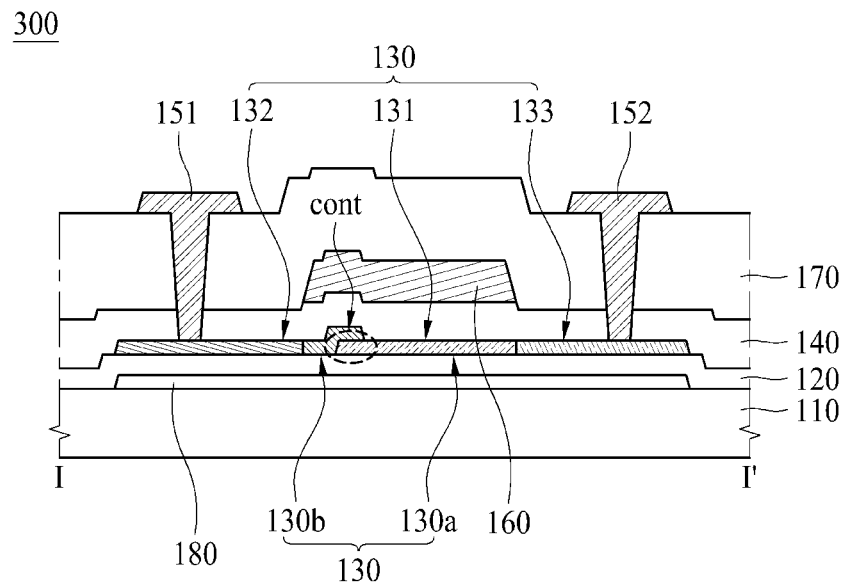
FIG. 5 is a cross sectional view illustrating a thin film transistor according to another embodiment of the present disclosure.

FIG. 5 is a cross sectional view illustrating a thin film transistor 300 according to another embodiment of the present disclosure.

Referring to FIG. 5, a light shielding layer 180 may be provided on a substrate 110. The light shielding layer 180 is formed of a light blocking material, and is disposed between the substrate 110 and a buffer layer 120. The light shielding layer 180 blocks externally-provided incident light, to thereby protect the active layer 130. In FIG. 5, the source region 132 is provided in the oxide semiconductor layer 130b, and the drain region 133 is provided in the silicon semiconductor layer 130a.

Figure 6:
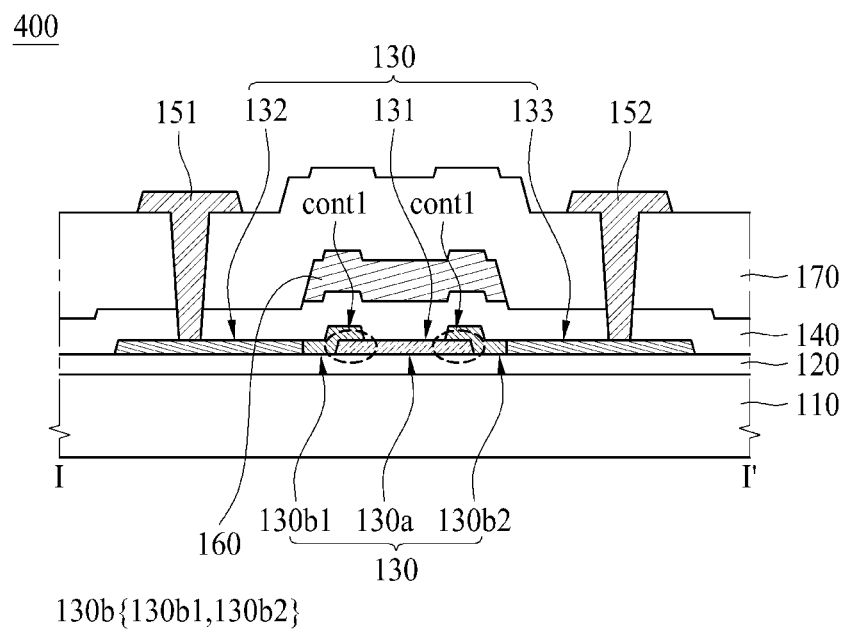
FIG. 6 is a cross sectional view illustrating a thin film transistor according to another embodiment of the present disclosure.

FIG. 6 is a cross sectional view illustrating a thin film transistor 400 according to another embodiment of the present disclosure.

Referring to FIG. 6, each of oxide semiconductor layer 130b1 and 130b2 may be disposed at each of one side and the other side of a silicon semiconductor layer 130a.

In more detail, the oxide semiconductor layer 130b shown in FIG. 6 includes a first portion 130b1 disposed at one side of the silicon semiconductor layer 130a and a second portion 130b2 disposed at the other side of the silicon semiconductor layer 130a. The silicon semiconductor layer 130a is overlapped with a gate electrode 160, and at least a portion of the first portion 130b1 of the oxide semiconductor layer 130b and at least a portion of the second portion 130b2 of the oxide semiconductor layer 130b are also overlapped with the gate electrode 160. In FIG. 6, the source region 132 is provided in the oxide semiconductor layer 130b, particularly provided in the first portion 130b1 of the oxide semiconductor layer 130b, and the drain region 133 is provided in the oxide semiconductor layer 130b, particularly provided in the second portion 130b2 of the oxide semiconductor layer 130b.

Contact portions (cont1, cont2) are provided at one side and the other side of the silicon semiconductor layer 130a.

The first contact portion (cont1) where the silicon semiconductor layer 130a and the first portion 130b1 of the oxide semiconductor layer 130b contact and the second contact portion (cont2) where the silicon semiconductor layer 130a and the second portion 130b2 of the oxide semiconductor layer 130b contact are entirely overlapped with the gate electrode 160.

According as the oxide semiconductor layer 130b (130b1 and 130b2) having the low off-current properties is disposed at each of both ends of the silicon semiconductor layer 130a in a channel portion 131, it is possible to improve the off-current properties of the thin film transistor 400, and to prevent a leakage current in an OFF-state of the thin film transistor 400.

Figure 7:
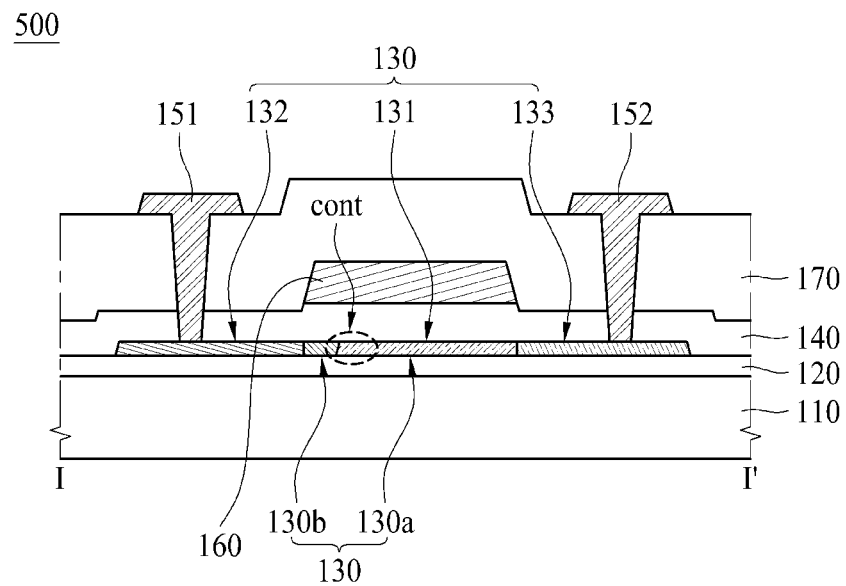
FIG. 7 is a cross sectional view illustrating a thin film transistor according to another embodiment of the present disclosure.

FIG. 7 is a cross sectional view illustrating a thin film transistor 500 according to another embodiment of the present disclosure. Referring to FIG. 7, a silicon semiconductor layer 130a and an oxide semiconductor layer 130b are not overlapped with each other in a thickness direction.

As described above, in consideration of a process error, in order to make a stable contact between the oxide semiconductor layer 130b and the silicon semiconductor layer 130a, according to one embodiment of the present disclosure, a portion of an end of the oxide semiconductor layer 130b is overlapped with a portion of an end of the silicon semiconductor layer 130a. However, as shown in FIG. 7, without any overlap between the oxide semiconductor layer 130b and the silicon semiconductor layer 130a, a lateral surface of the oxide semiconductor layer 130b may contact a lateral surface of the silicon semiconductor layer 130a by a precise adjustment of a patterning process in the oxide semiconductor layer 130b. In this case, the oxide semiconductor layer 130b and the silicon semiconductor layer 130a are not spaced apart from each other. In FIG. 7, the source region 132 is provided in the oxide semiconductor layer 130b, and the drain region 133 is provided in the silicon semiconductor layer 130a.

Figure 8:
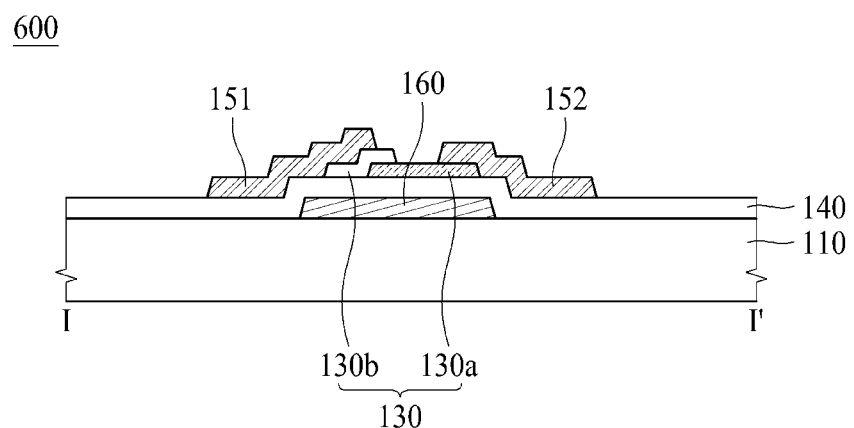
FIG. 8 is a cross sectional view illustrating a thin film transistor according to another embodiment of the present disclosure.

FIG. 8 is a cross sectional view illustrating a thin film transistor 600 according to another embodiment of the present disclosure.

The thin film transistor 600 of FIG. 8 includes a gate electrode 160 on a substrate 110, a gate insulating film 140 on the gate electrode 160, an active layer 130 on the gate insulating film 140, a source electrode 151 connected with the active layer 130, and a drain electrode 152 spaced apart from the source electrode 151 and connected with the active layer 130.

The active layer 130 includes a silicon semiconductor layer 130a, and an oxide semiconductor layer 130b which contacts the silicon semiconductor layer 130a.

As shown in FIG. 8, a structure in which a gate electrode 160 is disposed below the active layer 130 is referred to as a bottom gate structure. According to one embodiment of the present disclosure, the active layer 130 comprising the silicon semiconductor layer 130a and the oxide semiconductor layer 130b which contact each other may be applied to the thin film transistor 600 having the bottom gate structure.

Figure 9A:
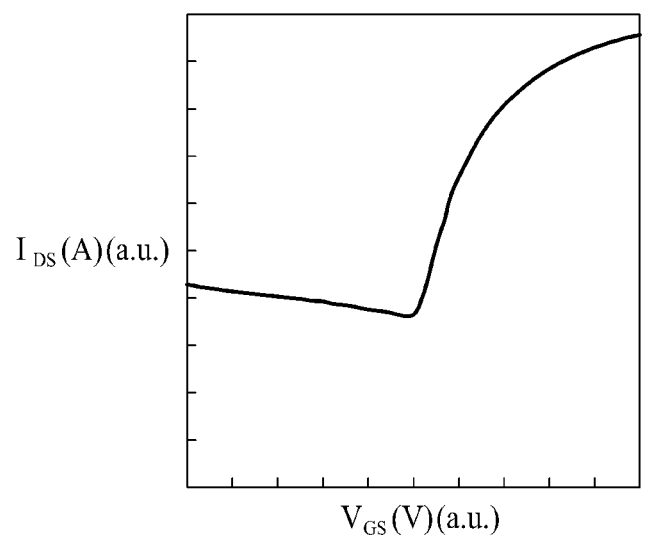
FIG. 9A is a graph showing a threshold voltage of a silicon thin film transistor.
Figure 9B:
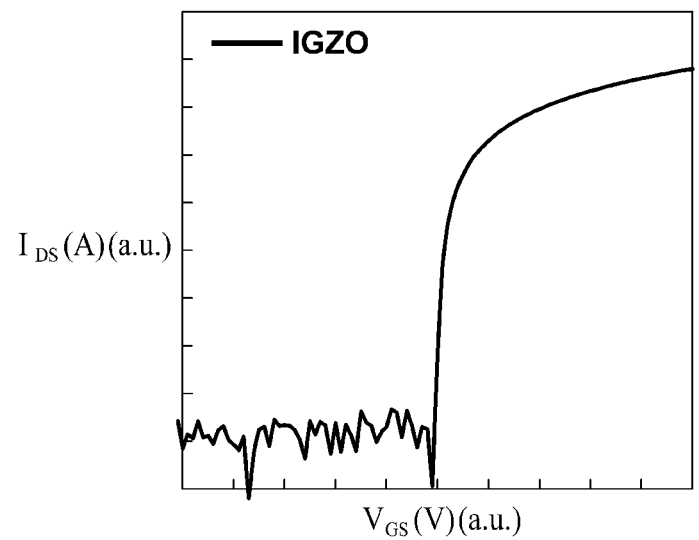
FIG. 9B is a graph showing a threshold voltage of an oxide semiconductor thin film transistor.

FIG. 9A is a graph showing a threshold voltage of the silicon thin film transistor, and FIG. 9B is a graph showing a threshold voltage of the oxide semiconductor thin film transistor.

Referring to FIG. 9A, the mobility of the silicon thin film transistor is relatively larger than the mobility of the oxide semiconductor thin film transistor (See FIG. 9B), whereby the silicon thin film transistor shows the relatively large current flow in an ON-state. Also, according to one embodiment of the present disclosure, the silicon thin film transistor (FIG. 9A) may have the relatively large s-factor in comparison to that of the oxide thin film transistor (FIG. 9B) by the adjustment of the s-factor in the silicon thin film transistor. For example, the s-factor of the silicon thin film transistor may be adjusted by a heat treatment.

The s-factor (sub-threshold swing: s-factor) of the thin film transistor may be obtained by a reciprocal number of an inclination in a drain-source current ($I_{DS}$) graph to a gate voltage ($V_{GS}$) for a threshold voltage (Vth) section of the thin film transistor. If the s-factor becomes large, it facilitates to control a level of the drain-source current ($I_{DS}$) by controlling the gate voltage ($V_{GS}$). Thus, the thin film transistor having the large s-factor may be used as a driving transistor of a display apparatus.

Referring to FIG. 9A, it is shown that the relatively large leakage current is generated in an OFF-state of the silicon thin film transistor. Thus, the silicon thin film transistor may have inferior off-current properties.

Referring to FIG. 9B, the leakage current is scarcely generated in an OFF-state of the oxide semiconductor thin film transistor in comparison to the silicon thin film transistor. Thus, the oxide semiconductor thin film transistor has the superior off-current properties.

Meanwhile, the oxide semiconductor thin film transistor has the relatively small mobility so that the current flow in an ON-state of the oxide semiconductor thin film transistor is relatively smaller than that of the silicon thin film transistor.

Figure 10:
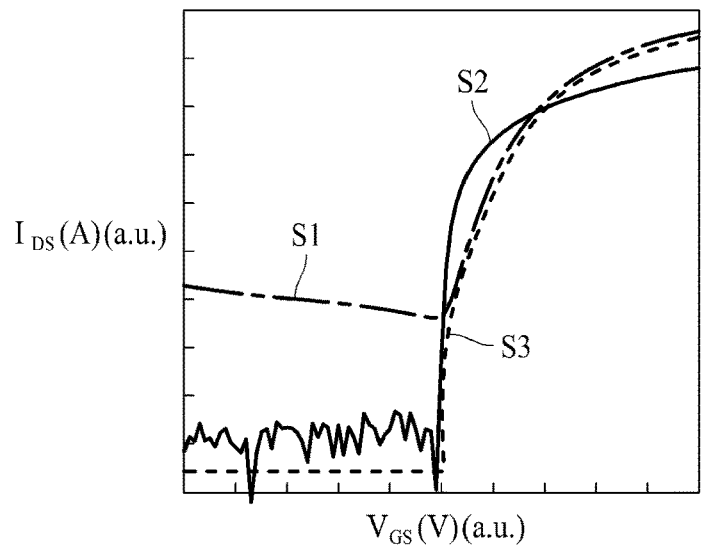
FIG. 10 is a graph showing a threshold voltage of a thin film transistor according to one embodiment of the present disclosure.

FIG. 10 is a graph (S3) of a threshold voltage in the thin film transistor 100 according to one embodiment of the present disclosure. In detail, in FIG. 10, 'S1' is a graph illustrating a threshold voltage of the silicon thin film transistor, 'S2' is a graph illustrating a threshold voltage of the oxide semiconductor thin film transistor, and 'S3' is a graph illustrating a threshold voltage of the thin film transistor 100 according to one embodiment of the present disclosure.

Referring to FIG. 10, the thin film transistor 100 according to one embodiment of the present disclosure has the greater off-current properties in comparison to the silicon thin film transistor, whereby the leakage current in an OFF-state is scarcely generated in the thin film transistor 100 according to one embodiment of the present disclosure. Also, it is shown that the thin film transistor 100 according to one embodiment of the present disclosure has the relatively large on-current and the relatively large s-factor in comparison to those of the oxide semiconductor thin film transistor.

Accordingly, the thin film transistor 100 according to one embodiment of the present disclosure may have the properties of the silicon thin film transistor, for example, the large mobility and the large s-factor, and also may have the properties of the oxide semiconductor thin film transistor, for example, the low off-current properties. Accordingly, the thin film transistor 100 according to one embodiment of the present disclosure may have the good current properties in an ON-state, and may prevent the leakage current in an OFF-state. Also, the thin film transistor 100 according to one embodiment of the present disclosure has the large s-factor, whereby the thin film transistor 100 according to one embodiment of the present disclosure may be used as a driving transistor of a display apparatus.

Figure 11:
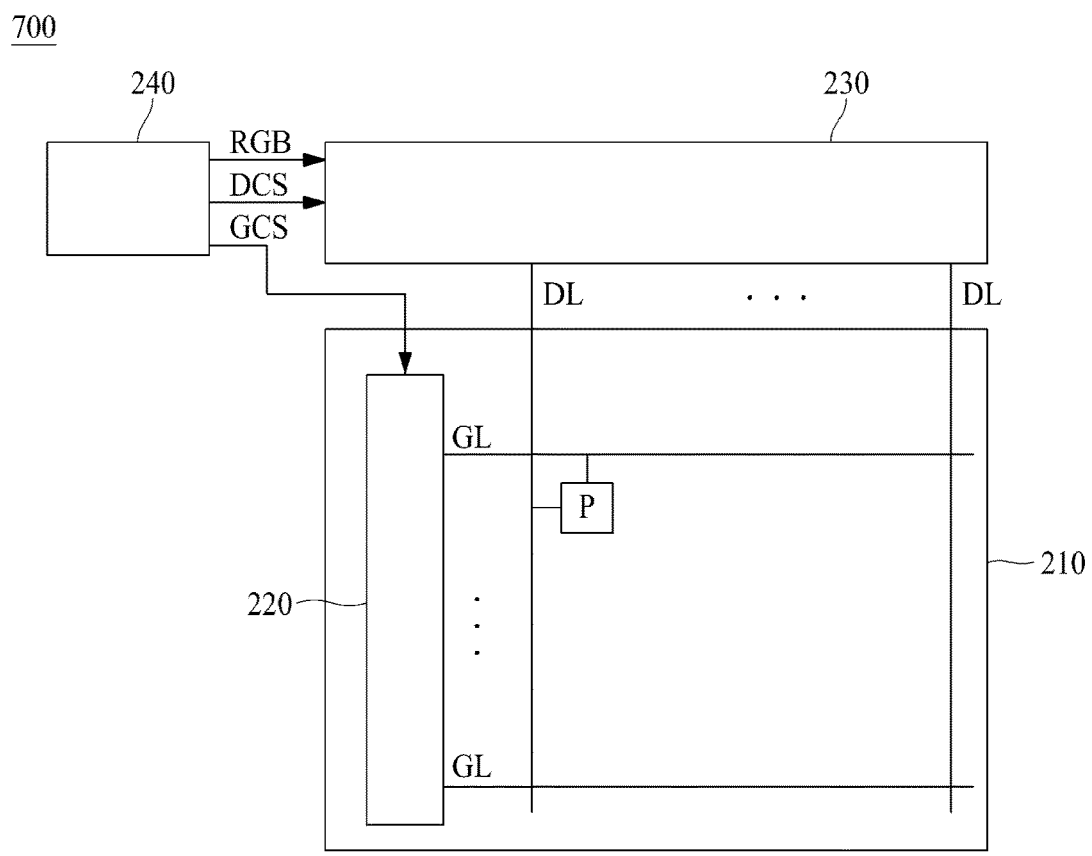
FIG. 11 is a schematic view illustrating a display apparatus according to another embodiment of the present disclosure.

FIG. 11 is a schematic view illustrating a display apparatus 700 according to another embodiment of the present disclosure.

As shown in FIG. 11, the display apparatus 700 according to another embodiment of the present disclosure includes a display panel 210, a gate driver 220, a data driver 230, and a controller 240.

On the display panel 210, there are gate lines (GL) and data lines (DL), and a pixel (P) arranged at a crossing portion of the gate line (GL) and the data line (DL). An image is displayed by driving the pixel (P).

The controller 240 controls the gate driver 220 and the data driver 230.

The controller 240 outputs a gate control signal (GCS) for controlling the gate driver 220 and a data control signal (DCS) for controlling the data driver 230 by the use of signals supplied from an external system (not shown). Also, the controller 240 samples input video data, which is provided from the external system, and then re-aligns the sampled video data, and supplies the re-aligned digital video data (RGB) to the data driver 230.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 230 supplies a data voltage to the data lines (DL) of the display panel 210. In detail, the data driver 230 converts the video data (RGB) provided from the controller 240 into an analog data voltage, and supplies the analog data voltage to the data lines (DL).

The gate driver 220 sequentially supplies a gate pulse (GP) to the gate lines (GL) for 1 frame period. Herein, "1 frame" indicates the period in which one image is output through the display panel. Also, the gate driver 220 supplies a gate-off signal for turning off the switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one embodiment of the present disclosure, the gate driver 220 may be provided on a substrate 110. A structure of directly providing the gate driver 220 on the substrate 110 may be referred to as Gate-In-Panel (GIP) structure.

Figure 12:
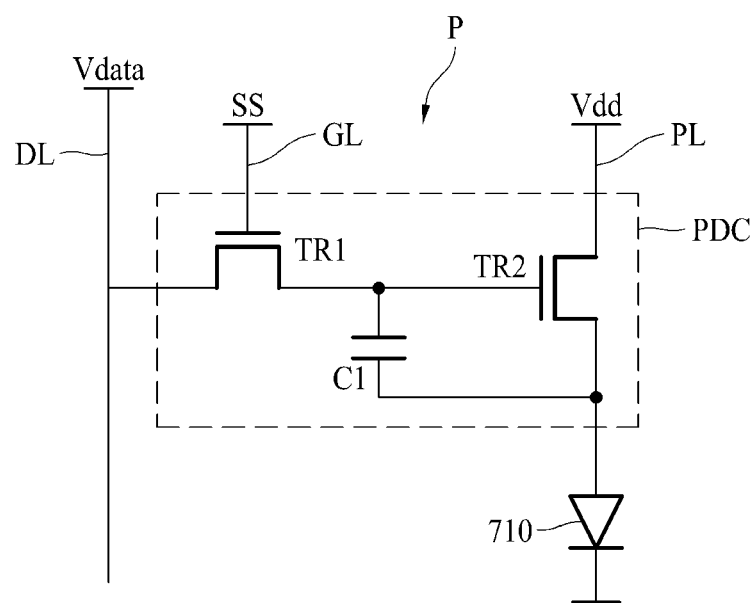
FIG. 12 is a circuit diagram illustrating any one pixel of FIG. 11 according to an embodiment of the present disclosure.
Figure 13:
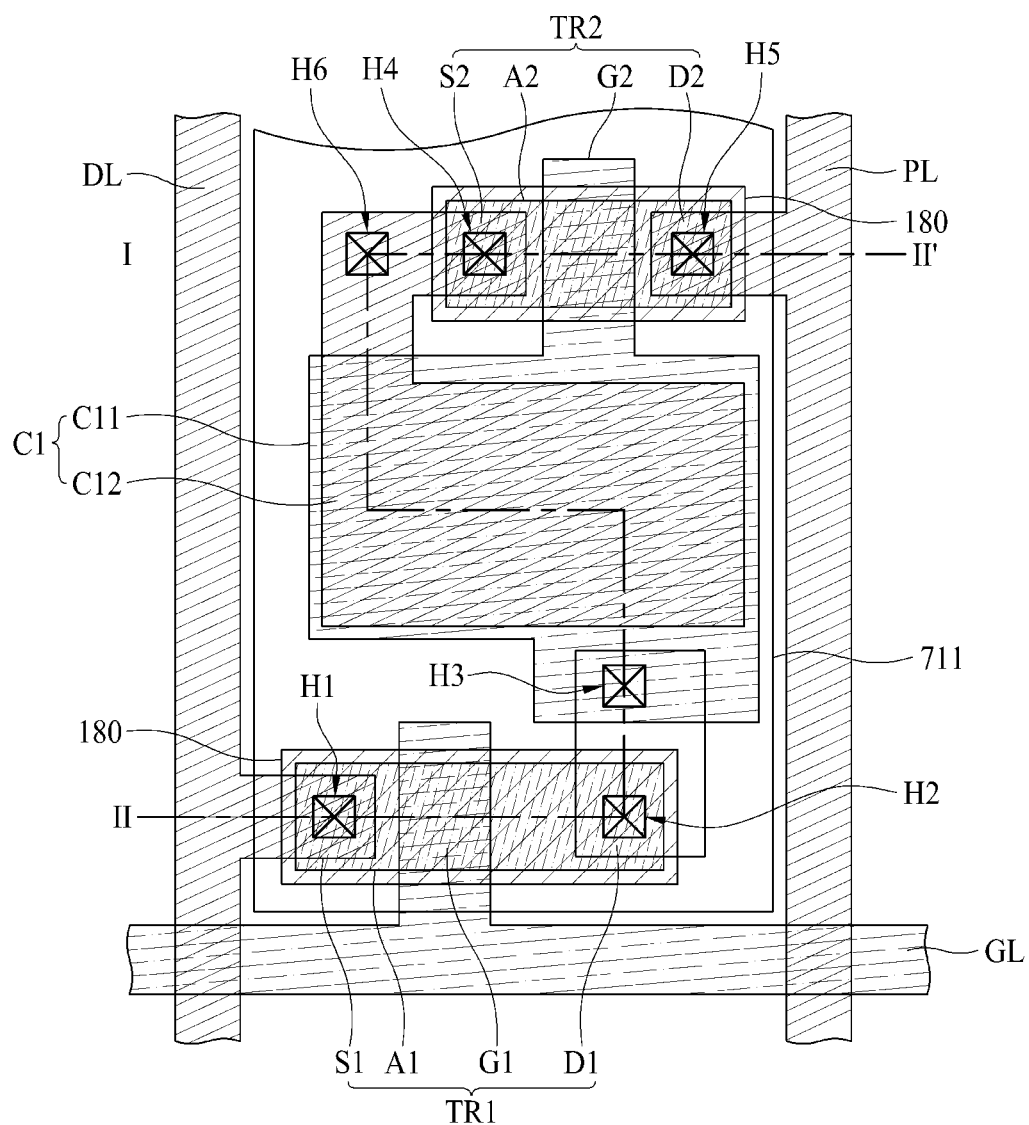
FIG. 13 is a plan view illustrating a pixel of FIG. 11 according to an embodiment of the present disclosure.
Figure 14:
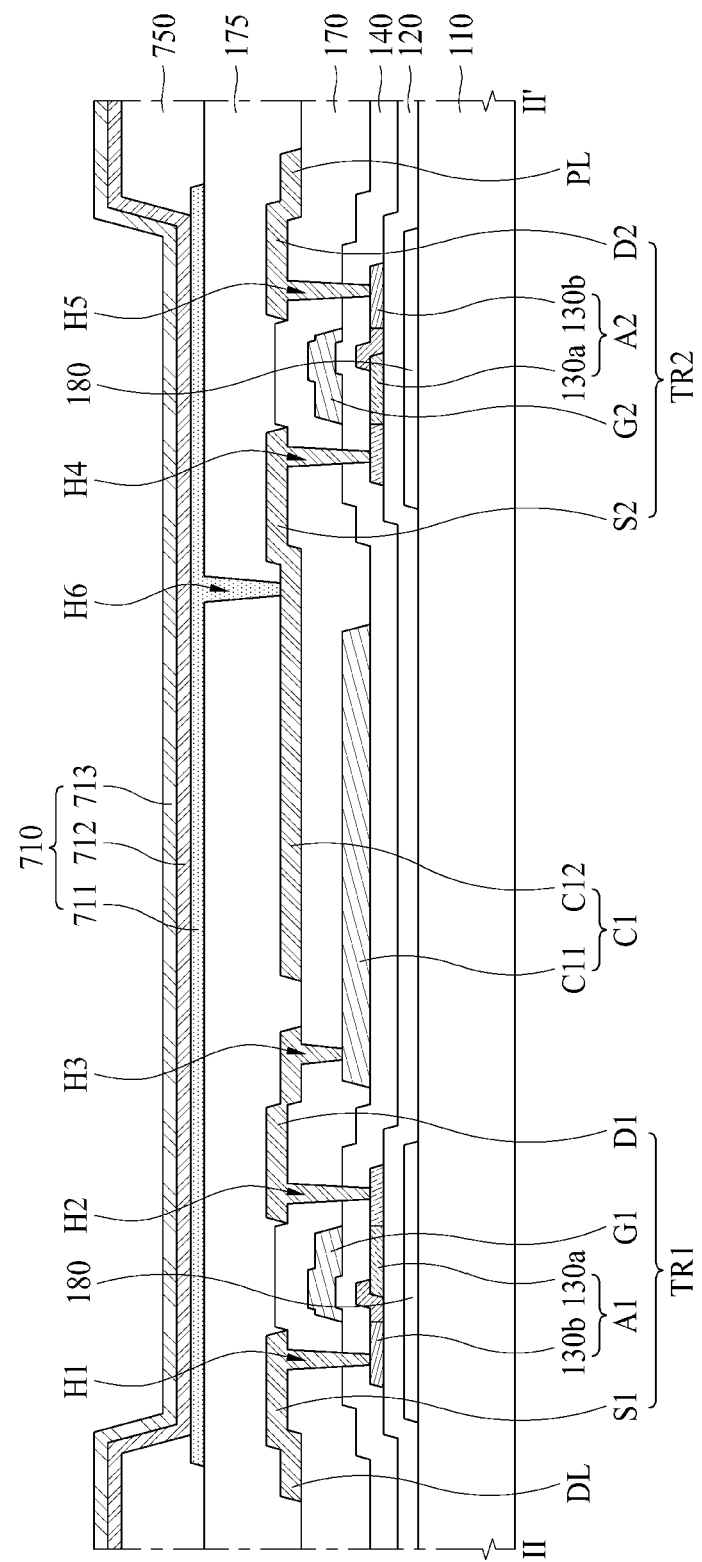
FIG. 14 is a cross sectional view along II-IT of FIG. 13 according to an embodiment of the present disclosure.

FIG. 12 is a circuit diagram illustrating any one pixel (P) of FIG. 11, FIG. 13 is a plan view illustrating the pixel (P) of FIG. 11, and FIG. 14 is a cross sectional view along II-II' of FIG. 13 according to one embodiment of the present disclosure.

The circuit diagram of FIG. 12 is an equivalent circuit diagram for one pixel (P1) in the display apparatus 700 comprising an organic light emitting diode (OLED) functioning as an display device 710.

The pixel (P) includes the display device 710, and a pixel driver (PDC) for driving the display device 710.

The pixel driver (PDC) of FIG. 12 includes a first thin film transistor (TR1) corresponding to a switching transistor, and a second thin film transistor (TR2) corresponding to a driving transistor. Each of the thin film transistors 100, 200, 300, 400, 500 and 600 shown in FIGS. 2, 4, 5, 6, 7 and 8 may be used for the first thin film transistor (TR1) and the second thin film transistor (TR2). Especially, the thin film transistors 100, 200, 300, 400, 500 and 600 shown in FIGS. 2, 4, 5, 6, 7 and 8 may be used for the second thin film transistor (TR2) corresponding to the driving transistor.

The first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driver (PDC), and the first thin film transistor (TR1) controls applying the data voltage (Vdata).

A driving power line (PL) provides a driving voltage (Vdd) to the display device 710, and the second thin film transistor (TR2) controls the driving voltage (Vdd). Herein, the driving voltage (Vdd) is a pixel driving voltage for driving the organic light emitting diode (OLED) corresponding to the display device 710.

When the first thin film transistor (TR1) is turned-on by the scan signal (SS) applied through the gate line (GL) from the gate driver 220, the data voltage (Vdata), which is supplied through the data line (DL), is supplied to a gate electrode (G2) of the second thin film transistor (TR2) connected with the display device 710. The data voltage (Vdata) is charged in a first capacitor (C1) provided between a source electrode (S2) and a gate electrode (G2) of the second thin film transistor (TR2). The first capacitor (C1) is a storage capacitor (Cst).

An amount of current supplied to the organic light emitting diode (OLED) corresponding to the display device 710 through the second thin film transistor (TR2) is controlled in accordance with the data voltage (Vdd), whereby it is possible to control a grayscale of light emitted from the display device 710.

Referring to FIGS. 13 and 14, the first thin film transistor (TR1) and the second thin film transistor (TR2) are provided on the substrate 110.

The substrate 110 may be formed of glass or plastic. The substrate 110 may be formed of plastic having flexibility, for example, polyimide (PI).

A light shielding layer 180 is disposed on the substrate 110. The light shielding layer 180 may function as a light blocking layer. The light shielding layer blocks externally-provided incident light, to thereby protect an active layer (A1) of the first thin film transistor (TR1), and an active layer (A2) of the second thin film transistor (TR2).

A buffer layer 120 is disposed on the light shielding layer 180. The buffer layer 120 is formed of an insulating material, and the buffer layer 120 protects the active layers (A1, A2) from externally-provided moisture or oxygen.

The active layer (A1) of the first thin film transistor (TR1) and the active layer (A2) of the second thin film transistor (TR2) are disposed on the buffer layer 120.

The active layer (A1, A2) includes a silicon semiconductor layer 130a, and an oxide semiconductor layer 130b which contacts the silicon semiconductor layer 130a.

The silicon semiconductor layer 130a may include at least one of amorphous silicon and polycrystalline silicon. For example, the silicon semiconductor layer 130a may be formed of low temperature polysilicon (LTPS).

The oxide semiconductor layer 130b may include an oxide semiconductor material.

The oxide semiconductor layer 130b may have a multi-layered structure. In more detail, the oxide semiconductor layer 130b may include a first oxide semiconductor layer 31b, and a second oxide semiconductor layer 32b on the first oxide semiconductor layer 31b.

A gate insulating film 140 is disposed on the active layer (A1, A2). The gate insulating film 140 has the insulating properties.

A gate electrode (G1) of the first thin film transistor (TR1) and the gate electrode (G2) of the second thin film transistor (TR2) are disposed on the gate insulating film 140.

The gate electrode (G1) of the first thin film transistor (TR1) is overlapped with at least a portion of the silicon semiconductor layer 130a included in the active layer (A1) of the first thin film transistor (TR1), and at least a portion of the oxide semiconductor layer 130b included in the active layer (A1) of the first thin film transistor (TR1).

The gate electrode (G2) of the second thin film transistor (TR2) is overlapped with at least a portion of the silicon semiconductor layer 130a included in the active layer (A2) of the second thin film transistor (TR2), and at least a portion of the oxide semiconductor layer 130b included in the active layer (A2) of the second thin film transistor (TR2).

Referring to FIGS. 13 and 14, a first capacitor electrode (C11) of a first capacitor (C1) is disposed on the same layer as that of the gate electrode (G1, G2). The gate electrode (G1, G2) and the first capacitor electrode (C11) may be manufactured together by the same process using the same material.

An insulating interlayer 170 is disposed on the gate electrode (G1, G2) and the first capacitor electrode (C11).

A source electrode (S1, S2) and a drain electrode (D1, D2) are disposed on the insulating interlayer 170. According to one embodiment of the present disclosure, for convenience of explanation, the source electrode (S1, S2) and the drain electrode (D1, D2) are distinguished from each other. However, the source electrode (S1, S2) and the drain electrode (D1, D2) are used interchangeably. Thus, the source electrode (S1, S2) may be the drain electrode (D1, D2), and the drain electrode (D1, D2) may be the source electrode (S1, S2).

Also, the data line (DL) and the driving power line (PL) are disposed on the insulating interlayer 170. The source electrode (S1) of the first thin film transistor (TR1) may be formed as one body with the data line (DL). The drain electrode (D2) of the second thin film transistor (TR2) may be formed as one body with the driving power line (PL).

According to one embodiment of the present disclosure, the source electrode (S1) of the first thin film transistor (TR1) and the drain electrode (D1) of the first thin film transistor (TR1) are spaced apart from each other, and are connected with the active layer (A1) of the first thin film transistor (TR1). The source electrode (S2) of the second thin film transistor (TR2) and the drain electrode (D2) of the second thin film transistor (TR2) are spaced apart from each other, and are connected with the active layer (A2) of the second thin film transistor (TR2).

In detail, the source electrode (S1) of the first thin film transistor (TR1) contacts a source region of the active layer (A1) through a first contact hole (H1).

The drain electrode (D1) of the first thin film transistor (TR1) contacts a drain region of the active layer (A1) through a second contact hole (H2), and the drain electrode (D1) of the first thin film transistor (TR1) is connected with the first capacitor electrode (C11) of the first capacitor (C1) through a third contact hole (H3).

The source electrode (S2) of the second thin film transistor (TR2) extends onto the insulating interlayer 170, whereby a portion of the source electrode (S2) functions as a second capacitor electrode (C12) of the first capacitor (C1). The first capacitor electrode (C11) and the second capacitor electrode (C12) are overlapped with each other so that it is possible to form the first capacitor (C1).

Also, the source electrode (S2) of the second thin film transistor (TR2) contacts a source region of the active layer (A2) through a fourth contact hole (H4).

The drain electrode (D2) of the second thin film transistor (TR2) contacts the drain region of the active layer (A2) through a fifth contact hole (H5).

The first thin film transistor (TR1) includes the active layer (A1), the gate electrode (G1), the source electrode (S1), and the drain electrode (D1), and the first thin film transistor (TR1) serves as the switching transistor for controlling the data voltage (Vdata) applied to the pixel driver (PDC).

The second thin film transistor (TR2) includes the active layer (A2), the gate electrode (G2), the source electrode (S2), and the drain electrode (D2), and the second thin film transistor (TR2) serves as the driving transistor for controlling the driving voltage (Vdd) applied to the display device 710.

A protection layer 175 is disposed on the source electrode (S1, S2), the drain electrode (D1, D2), the data line (DL), and the driving power line (PL). The protection layer 175 is provided to protect the first thin film transistor (TR1) and the second thin film transistor (TR2), and to planarize upper surfaces of the first thin film transistor (TR1) and the second thin film transistor (TR2).

A first electrode 711 of the display device 710 is disposed on the protection layer 175. The first electrode 711 of the display device 710 is connected with the source electrode (S2) of the second thin film transistor (TR2) through a sixth contact hole (H6).

A bank layer 750 is disposed on the edge of the first electrode 711. The bank layer 750 defines an emission area of the display device 710.

An organic emission layer 712 is disposed on the first electrode 711, and a second electrode 713 is disposed on the organic emission layer 712, whereby the display device 710 is completed. The display device 710 shown in FIG. 14 is the organic light emitting diode (OLED). Accordingly, the display apparatus 100 according to one embodiment of the present disclosure is an organic light emitting display apparatus.

According to one embodiment of the present disclosure, the second thin film transistor (TR2) has a large s-factor, whereby a change rate of a drain-source current ($I_{DS}$) to a gate voltage ($V_{GS}$) for a threshold voltage (Vth) section becomes gentle. Thus, it facilitates to control a level of the drain-source current ($I_{DS}$) of the second thin film transistor (TR2) by adjusting a voltage applied to the gate electrode (G2) of the second thin film transistor (TR2). A pixel grayscale may be controlled by controlling the level of the drain-source current (IDs). When it facilitates to control the level of the drain-source current ($I_{DS}$), it facilitates to control the pixel grayscale. Thus, according to one embodiment of the present disclosure, if the second thin film transistor (TR2) is used as the driving thin film transistor, it facilitates to express the pixel grayscale.

Figure 15:
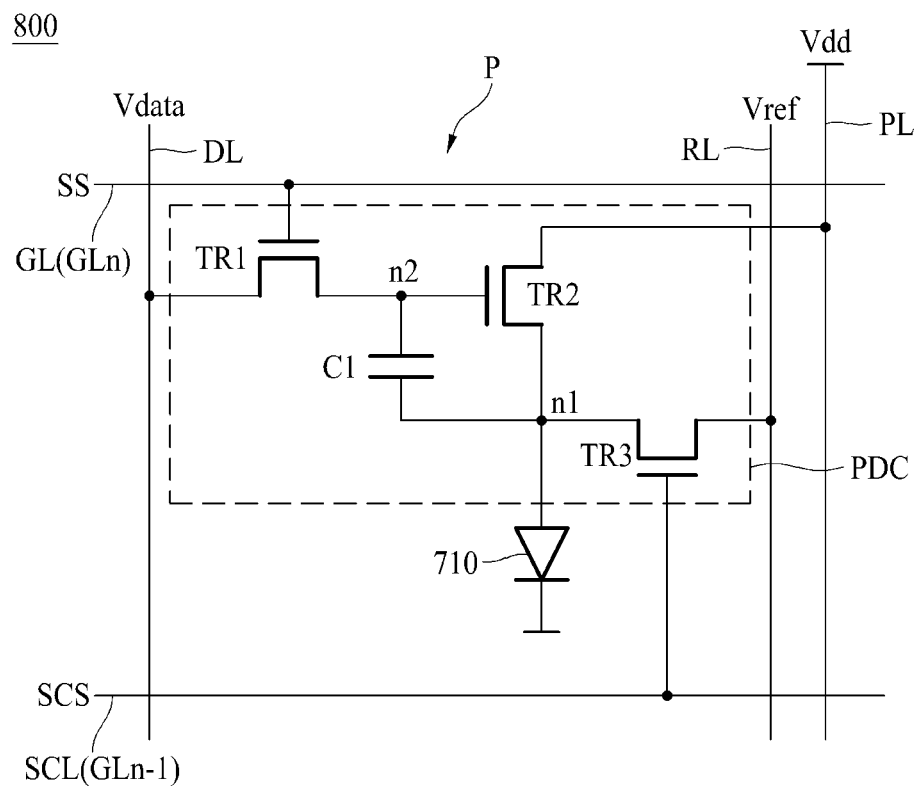
FIG. 15 is a circuit diagram illustrating a pixel of a display apparatus according to another embodiment of the present disclosure.

FIG. 15 is a circuit diagram for a pixel (P) of a display apparatus 800 according to another embodiment of the present disclosure.

FIG. 15 is an equivalent circuit diagram for a pixel (P) of an organic light emitting display apparatus.

The pixel (P) of the display apparatus 800 shown in FIG. 15 includes an organic light emitting diode (OLED) corresponding to a display device 710, and a pixel driver (PDC) configured to drive the display device 710. The display device 710 is connected with the pixel driver (PDC).

In the pixel (P), there are signal lines (DL, GL, PL, RL, SCL) configured to supply signals to the pixel driver (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 15, when the gate line of the (n)th pixel (P) is referred to as "$GL_n$", the gate line of the neighboring (n-1)th pixel (P) is "$GL_{n-1}$", and "$GL_{n-1}$" corresponding to the gate line of the (n-1)th pixel (P) serves as the sensing control line (SCL) of the (n)th pixel (P).

For example, the pixel driver (PDC) includes a first thin film transistor (TR1, switching transistor) connected with the gate line (GL) and the data line (DL), a second thin film transistor (TR2, driving transistor) configured to control a level of current which is provided to the display device 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display device 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, a current is supplied to the display device 710 through the second thin film transistor (TR2) by the driving voltage (Vdd) for driving the pixel, whereby light is emitted from the display device 710.

Each of the first thin film transistor (TR1), the second thin film transistor (TR2), and the third thin film transistor (TR3) shown in FIG. 15 may have a structure which is identical to that of any one among the thin film transistors 100, 200, 300, 400, 500 and 600 shown in FIGS. 2, 4, 5, 6, 7 and 8.

Figure 16:
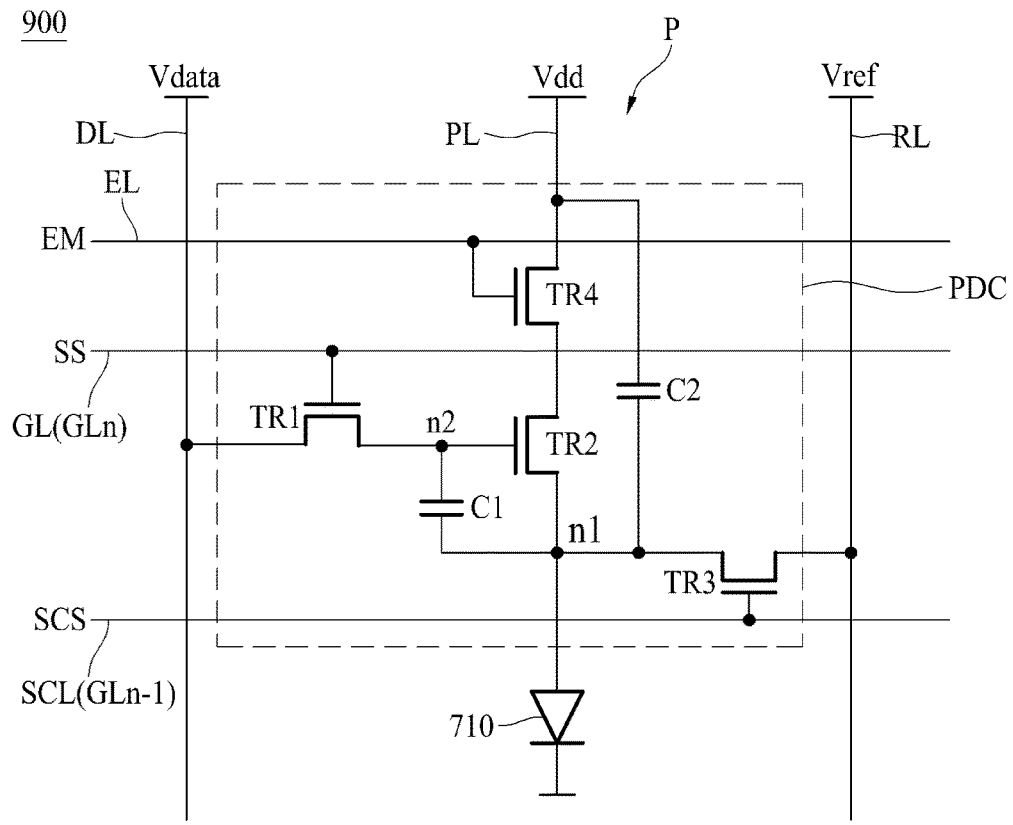
FIG. 16 is a circuit diagram illustrating a pixel of a display apparatus according to another embodiment of the present disclosure.

FIG. 16 is a circuit diagram for a pixel (P) of a display apparatus 900 according to another embodiment of the present disclosure.

The pixel (P) of the display apparatus 900 shown in FIG. 16 includes an organic light emitting diode (OLED) corresponding to a display device 710, and a pixel driver (PDC) configured to drive the display device 710. The display device 710 is connected with the pixel driver (PDC).

The pixel driver (PDC) includes thin film transistors (TR1, TR2, TR3, TR4).

In the pixel (P), there are signal lines (DL, EL, GL, PL, SCL, RL) configured to supply driving signals to the pixel driver (PDC).

In comparison to the pixel (P) of FIG. 15, the pixel (P) of FIG. 16 further includes an emission control line (EL). An emission control signal (EM) is supplied to the emission control line (EL).

Also, in comparison to the pixel driver (PDC) of FIG. 15, the pixel driver (PDC) of FIG. 16 further includes a fourth thin film transistor (TR4) corresponding to an emission control transistor configured to control a light emission time point of the second thin film transistor (TR2).

Referring to FIG. 16, when the gate line of the (n)th pixel (P) is referred to as "$GL_n$", the gate line of the neighboring (n-1)th pixel (P) is "$GL_{n-1}$", and "$GL_{n-1}$" corresponding to the gate line of the (n-1)th pixel (P) serves as the sensing control line (SCL) of the (n)th pixel (P).

A first capacitor (C1) is positioned between the display device 710 and a gate electrode (G2) of the second thin film transistor (TR2). Also, a second capacitor (C2) is positioned between one electrode of the display device 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned-on or turned-off by the sensing control signal (SCS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, a current is supplied to the second thin film transistor (TR2), whereby light is emitted from the display device 710.

Each of the first thin film transistor (TR1), the second thin film transistor (TR2), the third thin film transistor (TR3), and the fourth thin film transistor (TR4) shown in FIG. 16 may have a structure which is identical to that of any one among the thin film transistors 100, 200, 300, 400, 500 and 600 shown in FIGS. 2, 4, 5, 6, 7 and 8.

The pixel driver (PDC) according to another embodiment of the present disclosure may be formed in various structures in addition to the above-described structure. For example, the pixel driver (PDC) may include five thin film transistors or more.

Figure 17:
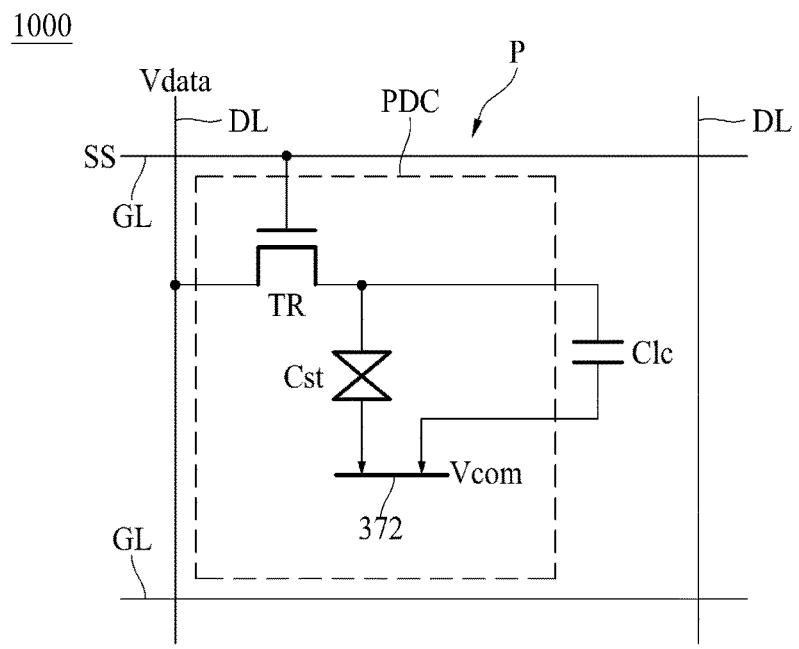
FIG. 17 is a circuit diagram illustrating a pixel of a display apparatus according to another embodiment of the present disclosure.

FIG. 17 is a circuit diagram for a pixel (P) of a display apparatus 1000 according to another embodiment of the present disclosure.

The display apparatus 1000 of FIG. 17 is a liquid crystal display apparatus.

The pixel (P) of the display apparatus 1000 shown in FIG. 17 includes a pixel driver (PDC), and a liquid crystal capacitor (Clc) connected with the pixel driver (PDC). The liquid crystal capacitor (Clc) corresponds to a display device.

The pixel driver (PDC) includes a thin film transistor (TR) connected with a gate line (GL) and a data line (DL), and a storage capacitor (Cst) connected between the thin film transistor (TR) and a common electrode 372. Between the thin film transistor (TR) and the common electrode 372, the liquid crystal capacitor (Clc) and the storage capacitor (Cst) are connected in parallel.

The liquid crystal capacitor (Clc) charges a differential voltage between a common voltage (Vcom) supplied to the common electrode 372 and a data signal supplied to a pixel electrode through the thin film transistor (TR), and controls a light transmission amount by driving liquid crystal in accordance with the charged voltage. The storage capacitor (Cst) stably maintains the voltage charged in the liquid crystal capacitor (Clc).

FIGS. 18A to 18E illustrate a process of manufacturing the thin film transistor 100 according to one embodiment of the present disclosure.

Figure 18A:
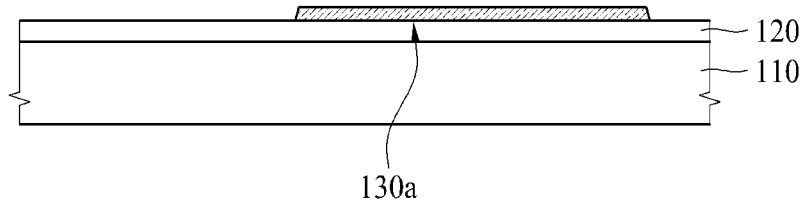
FIGS. 18A to 18E illustrate a process of manufacturing a thin film transistor according to one embodiment of the present disclosure.

Referring to FIG. 18A, the buffer layer 120 is provided on the substrate 110, and the silicon semiconductor layer 130a is provided on the buffer layer 120. The silicon semiconductor layer 130a is crystallized.

A crystallization process for forming the silicon semiconductor layer 130a may be needed. Thus, according to one embodiment of the present disclosure, the silicon semiconductor layer 130a is firstly provided on the substrate 110 before forming the oxide semiconductor layer 130b.

Figure 18B:
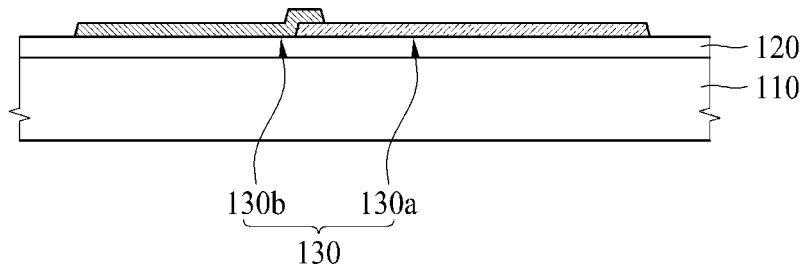

Referring to FIG. 18B, the oxide semiconductor layer 130b is provided on the buffer layer 120. The oxide semiconductor layer 130b contacts the silicon semiconductor layer 130a.

For the stable contact between the oxide semiconductor layer 130b and the silicon semiconductor layer 130a, according to one embodiment of the present disclosure, the oxide semiconductor layer 130b is provided in such a way that a portion of an end of the oxide semiconductor layer 130b is overlapped with a portion of an end of the silicon semiconductor layer 130a.

According as the silicon semiconductor layer 130a and the oxide semiconductor layer 130b are formed on the substrate 110, the active layer 130 may be made.

Figure 18C:
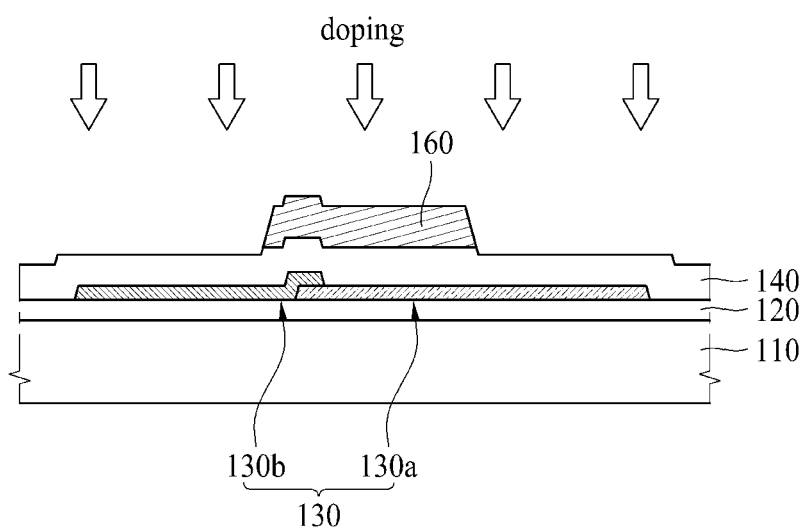

Referring to FIG. 18C, the gate insulating film 140 is provided on the active layer 130, and the gate electrode 160 is provided on the gate insulating film 140.

The gate electrode 160 is partially overlapped with the active layer 130. In detail, the gate electrode 160 is overlapped with at least a portion of the silicon semiconductor layer 130a and at least a portion of the oxide semiconductor layer 130b.

Then, the active layer 130 is selectively provided with conductivity by a process using the gate electrode 160 as a mask.

According to one embodiment of the present disclosure, as shown in FIG. 18C, the active layer 130 may be selectively provided with conductivity by a method for doping a portion of the active layer 130, which is not overlapped with the gate electrode 160, with ions. For the doping process, 5A group elements may be used. For example, at least one among phosphorous (P) ion, arsenic (As) ion, and antimony (Sb) ion may be used for the doping process.

However, one embodiment of the present disclosure is not limited to the above. For example, the active layer 130 may be selectively provided with conductivity by a plasma treatment or a dry etch process, or may be selectively provided with conductivity by a photo-irradiation process.

Figure 18D:
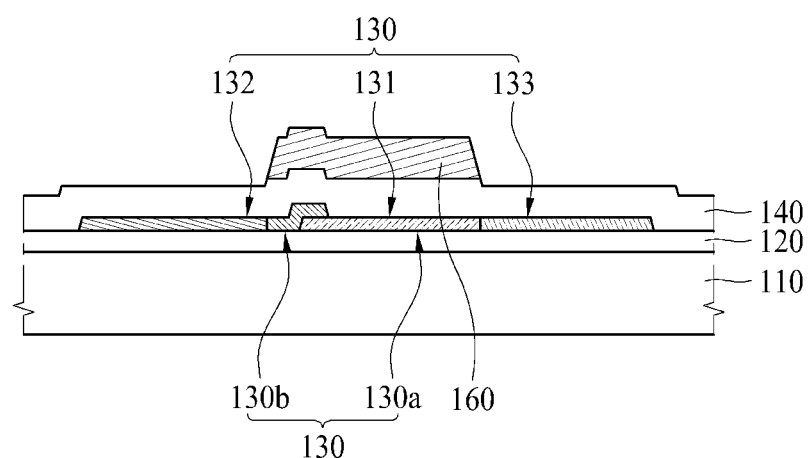

Referring to FIG. 18D, the conducting portions 132 and 133 are formed by the selective conductivity providing process for the active layer 130.

In detail, a portion of the active layer 130, which is overlapped with the gate electrode 160, is not provided with conductivity, and thus becomes the channel portion 131. Some portions of the active layer 130, which are not overlapped with the gate electrode 160, are provided with conductivity, and thus become the conducting portions 132 and 133. The conducting portions 132 and 133 are provided at both sides of the channel portion 131, generally.

Any one of the conducting portions 132 and 133 becomes the source region 132, and the other becomes the drain region 133. The source region 132 may function as the source connection portion connected with the source electrode 151, and the drain region 133 may function as the drain connection portion connected with the drain electrode 152.

Figure 18E:
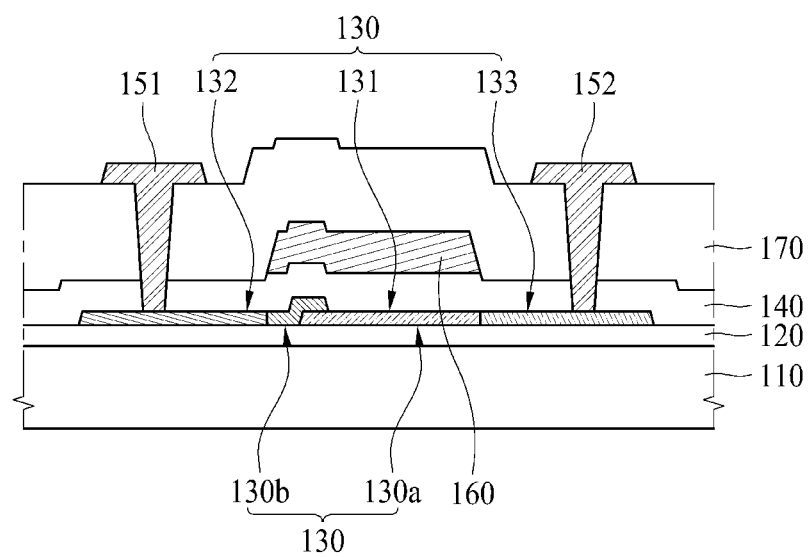

Referring to FIG. 18E, the insulating interlayer 170 is disposed on the gate electrode 160, and the source electrode 151 and the drain electrode 152 are disposed on the insulating interlayer 170.

The insulating interlayer 170 is an insulating layer of an insulating material. The source electrode 151 and the drain electrode 152 are spaced apart from each other, and are connected with the active layer 130. The source electrode 151 and the drain electrode 152 are respectively connected with the active layer 130 through contact holes provided in the insulating interlayer 170.

As a result, the thin film transistor 100 according to one embodiment of the present disclosure is made.

The thin film transistor according to another embodiment of the present disclosure includes both the oxide semiconductor layer and the silicon semiconductor layer so that it is possible to realize the good switching properties of the oxide semiconductor thin film transistor and also to realize the good mobility of the silicon thin film transistor.

The thin film transistor according to another embodiment of the present disclosure includes both the oxide semiconductor layer and the silicon semiconductor layer so that it is possible to obtain the good switching properties, the good mobility, and the large s-factor.

The display apparatus comprising the thin film transistor according to another embodiment of the present disclosure has the great display function.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor comprising:
   an active layer; and
   a gate electrode spaced apart from the active layer and configured to have at least a portion overlapped with the active layer,
   wherein the active layer includes:
   a silicon semiconductor layer; and
   an oxide semiconductor layer which contacts the silicon semiconductor layer,
   wherein at least a portion of the silicon semiconductor layer and at least a portion of the oxide semiconductor layer are overlapped with the gate electrode, and
   wherein the silicon semiconductor and the oxide semiconductor layer are not overlapped with each other in a thickness direction.

2. The thin film transistor according to claim 1, wherein the silicon semiconductor layer and the oxide semiconductor layer are disposed on a same layer.

3. The thin film transistor according to claim 1, wherein an entire area of a contact portion where the silicon semiconductor layer and the oxide semiconductor layer contact each other is overlapped with the gate electrode.

4. The thin film transistor according to claim 1, wherein the silicon semiconductor layer is provided to be 50% or more of an overlap area between the active layer and the gate electrode.

5. The thin film transistor according to claim 1, further comprising:
   a source electrode and a drain electrode which are spaced apart from each other and are respectively connected with the active layer,
   wherein any one of the source electrode and the drain electrode is connected with the silicon semiconductor layer, and
   the other of the source electrode and the drain electrode is connected with the oxide semiconductor layer.

6. The thin film transistor according to claim 1, wherein the active layer includes:
   a channel portion which is overlapped with the gate electrode;
   a source region which is connected with the channel portion and is not overlapped with the gate electrode; and
   a drain region which is spaced apart from the source region and connected with the channel region, and is not overlapped with the gate electrode,
   wherein, a distance between the source region and the drain region in the channel portion is referred to as a channel length, and wherein a length of a portion of the silicon semiconductor layer being not overlapped with the oxide semiconductor layer is 50% to 90% of the channel length.

7. The thin film transistor according to claim 6, wherein any one of the source region and the drain region is provided in the silicon semiconductor layer, and the other of the source region and the drain region is provided in the oxide semiconductor layer.

8. The thin film transistor according to claim 1, wherein the oxide semiconductor layer includes:
   a first oxide semiconductor layer; and
   a second oxide semiconductor layer on the first oxide semiconductor layer.

9. The thin film transistor according to claim 1, wherein a lateral surface of the oxide semiconductor layer contacts a lateral surface of the silicon semiconductor layer.

10. A display apparatus comprising the thin film transistor of claim 1.

11. The thin film transistor according to claim 1, wherein the silicon semiconductor layer is provided while being not overlapped with the oxide semiconductor layer in a corresponding area of 50% or more of an overlap area between the active layer and the gate electrode.

12. A thin film transistor comprising:
    an active layer; and
    a gate electrode spaced apart from the active layer and configured to have at least a portion overlapped with the active layer,
    wherein the active layer includes:
    a silicon semiconductor layer; and
    an oxide semiconductor layer which contacts the silicon semiconductor layer,
    wherein at least a portion of the silicon semiconductor layer and at least a portion of the oxide semiconductor layer are overlapped with the gate electrode,
    wherein a lateral surface of the oxide semiconductor layer contacts a lateral surface of the silicon semiconductor layer, and wherein an entire area of a contact portion where the silicon semiconductor layer and the oxide semiconductor layer contact each other is overlapped with the gate electrode.

13. The thin film transistor according to claim 12, wherein the silicon semiconductor layer is provided to be 50% or more of an overlap area between the active layer and the gate electrode.

14. The thin film transistor according to claim 12, wherein at least a portion of the oxide semiconductor layer is overlapped with the silicon semiconductor layer in a thickness direction.

15. The thin film transistor according to claim 12, further comprising:
   a source electrode and a drain electrode which are spaced apart from each other and are respectively connected with the active layer,
   wherein any one of the source electrode and the drain electrode is connected with the silicon semiconductor layer, and
   the other of the source electrode and the drain electrode is connected with the oxide semiconductor layer.

16. The thin film transistor according to claim 12, wherein the active layer includes:
   a channel portion which is overlapped with the gate electrode;
   a source region which is connected with the channel portion and is not overlapped with the gate electrode; and
   a drain region which is spaced apart from the source region and connected with the channel region, and is not overlapped with the gate electrode,
   wherein, a distance between the source region and the drain region in the channel portion is referred to as a channel length, and wherein a length of a portion of the silicon semiconductor layer being not overlapped with the oxide semiconductor layer is 50% to 90% of the channel length.

17. The thin film transistor according to claim 16, wherein the oxide semiconductor layer which is not overlapped with the silicon semiconductor layer is provided in at least some regions of the channel portion along a line configured to connect the source region and the drain region with each other.

18. The thin film transistor according to claim 16, wherein any one of the source region and the drain region is provided in the silicon semiconductor layer, and the other of the source region and the drain region is provided in the oxide semiconductor layer.

19. The thin film transistor according to claim 12, wherein the oxide semiconductor layer is disposed at each of one side and the other side of the silicon semiconductor layer.

* * * * *